United States Patent
Fry

(12) 
(10) Patent No.: US 6,621,361 B1
(45) Date of Patent: Sep. 16, 2003

(54) DUAL OVEN OSCILLATOR USING A THERMOELECTRIC MODULE

(75) Inventor: Steven J. Fry, Carlisle, PA (US)

(73) Assignee: CTS Corporation, Elkhart, IN (US)

( * ) Notice: Subject to any disclaimer, the term of this patent is extended or adjusted under 35 U.S.C. 154(b) by 362 days.

(21) Appl. No.: 09/690,336

(22) Filed: Oct. 17, 2000

(51) Int. Cl.[7] .............. H03B 1/00; H03B 5/32; H03B 5/36
(52) U.S. Cl. .............. 331/69; 331/68; 331/158
(58) Field of Search .................. 331/66, 68, 69, 331/116 R, 116 FE, 158, 176

(56) References Cited

U.S. PATENT DOCUMENTS

| | | | |
|---|---|---|---|
| 3,287,658 A | * 11/1966 | Sulzer | 331/69 |
| 3,619,806 A | * 11/1971 | Phillips | 331/69 |
| 3,668,527 A | * 6/1972 | Easton | 325/115 |
| 4,097,829 A | 6/1978 | Cohen | |
| 5,569,950 A | 10/1996 | Lewis | |
| 5,637,921 A | 6/1997 | Burward-Hoy | |
| 5,887,435 A | 3/1999 | Morton | |
| 5,917,272 A | * 6/1999 | Clark et al. | 310/343 |
| 5,918,469 A | 7/1999 | Cardella | |
| 6,166,608 A | * 12/2000 | Merriss et al. | 331/69 |

* cited by examiner

Primary Examiner—David Mis
(74) Attorney, Agent, or Firm—Mark P. Bourgeois; Mark W. Borgman

(57) ABSTRACT

An ovenized oscillator has two ovens. One of the ovens is heated by a heater and the other is cooled by a thermoelectric module. The ovenized oscillator has an inner oven with an oscillator located inside. A thermoelectric heat pump cools the inner oven. An outer oven contains the inner oven and the thermoelectric heat pump. A heater heats the outer oven. The ovenized oscillator is operated with the inner oven temperature being lower than the outer oven temperature to improve component life and reduce crystal aging.

9 Claims, 2 Drawing Sheets

DUAL OVEN OSCILLATOR USING A THERMOELECTRIC MODULE

BACKGROUND OF THE PREFERRED EMBODIMENT(S)

1. Field of the Preferred Embodiment(s)

This invention relates to oscillators which provide a stable reference frequency signal in computers or other electronic equipment. Specifically, there is an ovenized oscillator that has two ovens. One of the ovens is heated and the other is cooled by a thermoelectric module.

2. Description of the Related Art

Various devices are well known for providing a reference frequency or source such devices are called oscillators. The oscillator typically has a quartz crystal or other resonator and also has electronic compensation circuitry to stabilize the output frequency.

Various methods are known to stabilize the output frequency as the temperature of the oscillator changes. Temperature compensated crystal oscillators (TCXO's) typically employ a thermistor network to generate a correction voltage which reduces the frequency variation over temperature. The correction voltage is usually applied to a varactor diode in the crystal circuit such that the crystal frequency may be varied by a small amount. TCXO stability can approach 0.1 PPM but several problems must be addressed. A TCXO that resides at one temperature extreme for an extended period of time may exhibit a frequency shift when returned to normal room temperature. Usually this hysterisis or "retrace" error is temporary but a seemingly permanent offset is common. Retrace errors are usually less than about 0.1 PPM but can be much higher, especially if the mechanical tuning device (trimmer capacitor or potentiometer) is shifting. This hysterisis makes the manufacture of TCXOs with specifications approaching 0.1 PPM quite difficult. The high precision crystals found in oven oscillators exhibit less retrace but they are unsuitable for use in TCXOs because they often exhibit activity dips at temperatures below the designed oven temperature and SC-cuts and high overtone types cannot be tuned by a sufficient amount to compensate for the frequency excursion. In addition SC cut crystals are very expensive. TCXOs are preferred to oven oscillators in low power applications and when a warm-up period is not acceptable. The only warm-up time is the time required for the components to reach thermal equilibrium and the total current consumption can be very low—often determined by the output signal power requirements. Older TCXO designs employ from one to three thermistors to flatten the crystal temperature frequency curve. Newer designs employ digital logic or a microprocessor to derive a correction voltage from values or coefficients stored in memory.

Ovenized oscillators heat the temperature sensitive portions of the oscillator which is isolated from the ambient to a uniform temperature to obtain a more stable output. Ovenized oscillators contain a heater, a temperature sensor and circuitry to control the heater. The temperature control circuitry holds the crystal and critical circuitry at a precise, constant temperature. The best controllers are proportional, providing a steady heating current which changes with the ambient temperature to hold the oven at a precise set-point, usually about 10 degrees above the highest expected ambient temperature. Temperature induced frequency variations can be greatly reduced by an amount approaching the thermal gain of the oven. The crystal for the oven is selected to have a "turning-point" at or near the oven temperature further reducing the sensitivity to temperature. The combination of the high oven gain with operation near turning point yields temperature stabilities as good as 0.0001 PPM over a temperature range that would cause the crystal to change by 10 PPM. Highly polished, high-Q crystals which often have significant activity dips may be designed with no activity dips near the operating temperature providing better stability and phase noise than crystals designed for wide temperature ranges. Ovenized oscillators allow the use of SC-cut crystals which offer superior characteristics but which are impractical for ordinary TCXOs because of their steep frequency drop at cooler temperatures. Unfortunately SC cut crystals are much more expensive to produce than AT cut crystals typically used in TCXO's. Oven oscillators have a higher power consumption than temperature compensated oscillators. Oven oscillators require a few minutes to warm-up and the power consumption is typically one or two watts at room temperature.

In order to improve frequency stabilities beyond that of an regular ovenized oscillator, ovenized oscillators using 2 ovens have been designed. In a double oven configuration, 2 insulated enclosures are placed inside each other with a proportionally controlled heater assembly for each. In order to maintain temperature control of the assembly under varying ambient conditions, it is necessary to maintain a differential of about 10 degrees Celsius between the highest ambient temperature to be experienced and the setpoint of the outer oven. Another 10 degrees Celsius differential is then required between the outer oven and the inner oven. The total heat rise above ambient between the crystal and the outside of the outer oven is more than 20 degrees Celsius. If the ambient temperature is high, the inner oven may need to operate at temperatures of around 110 degrees Celsius. There are several significant disadvantages of operating an oscillator at this high of a temperature. First, the reliability of electronic components decreases with temperature. The mean time between failures (MTBF) or operating lifetime of the circuit assembly is reduced as the temperature increases. In order to improve the failure rate, higher grade components must be used or more time spent screening components. Second, aging of the crystal resonator is accelerated. Crystals age more rapidly at higher temperatures. As the crystal ages, its frequency shifts causing frequency stability to rapidly degrade.

Despite the advantages of the prior art oscillators, an unmet need exists for a dual oven oscillator that can operate with high frequency stability at high ambient temperatures.

SUMMARY OF THE PREFERRED EMBODIMENT(S)

It is a feature of the invention to provide an ovenized oscillator that has two ovens. One of the ovens is heated and the other is cooled by a thermoelectric module.

A further feature of the invention is to provide an ovenized oscillator assembly that includes an oscillator for producing a reference frequency. A first temperature controlled oven has an oscillator located inside. A thermoelectric heat pump is in thermal communication with the first temperature controlled oven. The thermoelectric heat pump keeps the first oven at a first temperature. The thermoelectric heat pump and first oven are located inside the second temperature controlled oven. A heater is in thermal communication with the second temperature controlled oven. The heater keeps the second oven at a second temperature. The first temperature is less than the second temperature.

A further feature of the invention is to provide an ovenized oscillator assembly that includes an outer temperature controlled oven and an inner temperature controlled oven contained within the outer temperature controlled oven. An oscillator is located inside the inner temperature controlled oven. The temperature of the outer oven is higher than the temperature of the inner oven.

A further feature of the invention is to provide a method of operating an oscillator to provide a reference frequency signal that includes: providing an oscillator operable to produce a reference frequency and a first and a second temperature controlled oven. The oscillator is located inside the first temperature controlled oven. The first oven is located inside the second oven. Cooling the first oven and heating the second oven such that a first oven temperature is lower than a second oven temperature.

The invention resides not in any one of these features per se, but rather in the particular combination of all of them herein disclosed and claimed. Those skilled in the art will appreciate that the conception, upon which this disclosure is based, may readily be utilized as a basis for the designing of other structures, methods and systems for carrying out the several purposes of the present invention. Further, the abstract is neither intended to define the invention of the application, which is measured by the claims, neither is it intended to be limiting as to the scope of the invention in any way.

BRIEF DESCRIPTION OF THE DRAWINGS

These and other features of the invention can best be understood by the following description of the accompanying drawings as follows.

It is noted that the drawings of the invention are not to scale. The invention will be described with additional specificity and detail through the accompanying drawings.

DETAILED DESCRIPTION OF THE PREFERRED EMBODIMENT(S)

Figure 1:
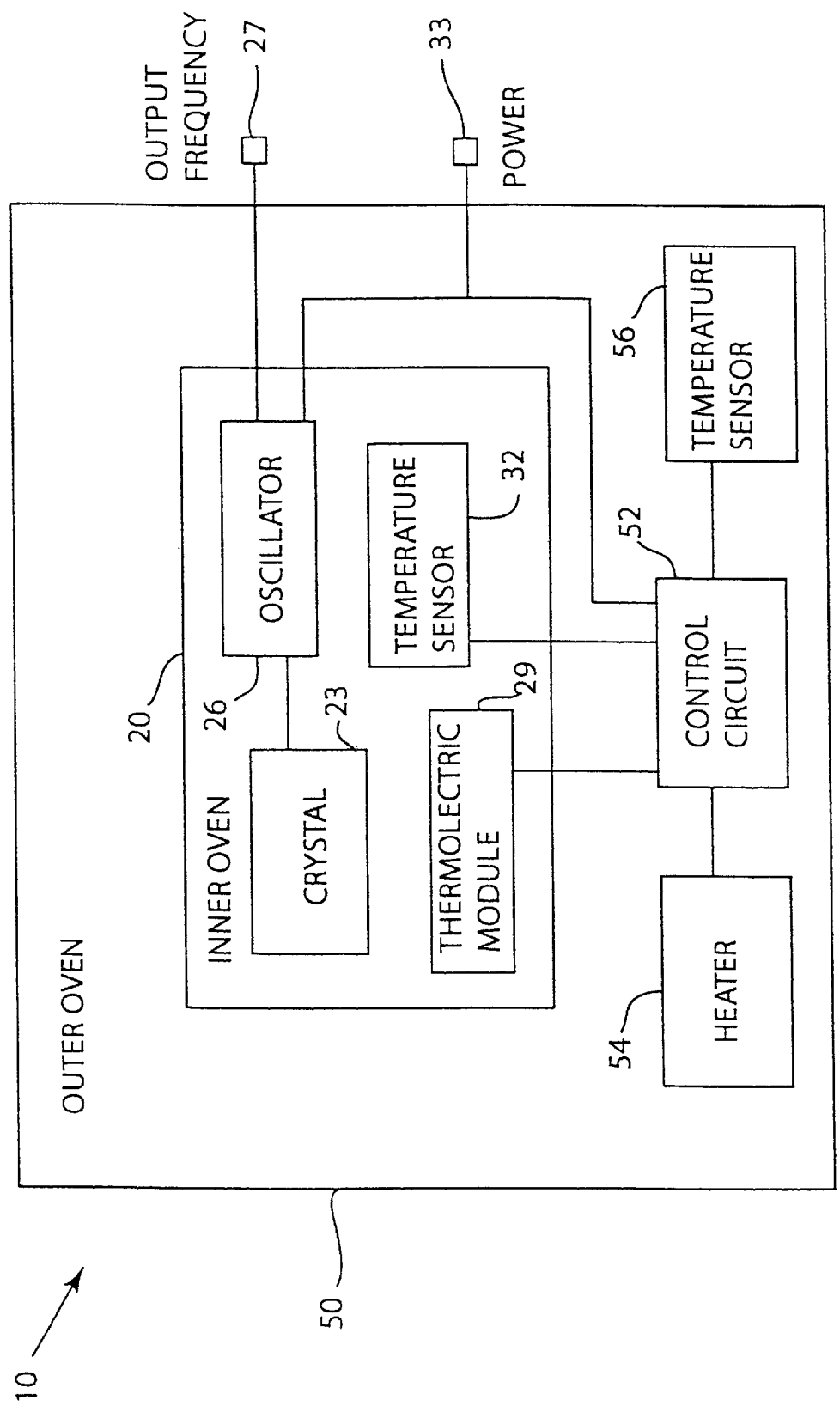
FIG. 1 is a diagrammatic view of the preferred embodiment of the invention.
Figure 2:
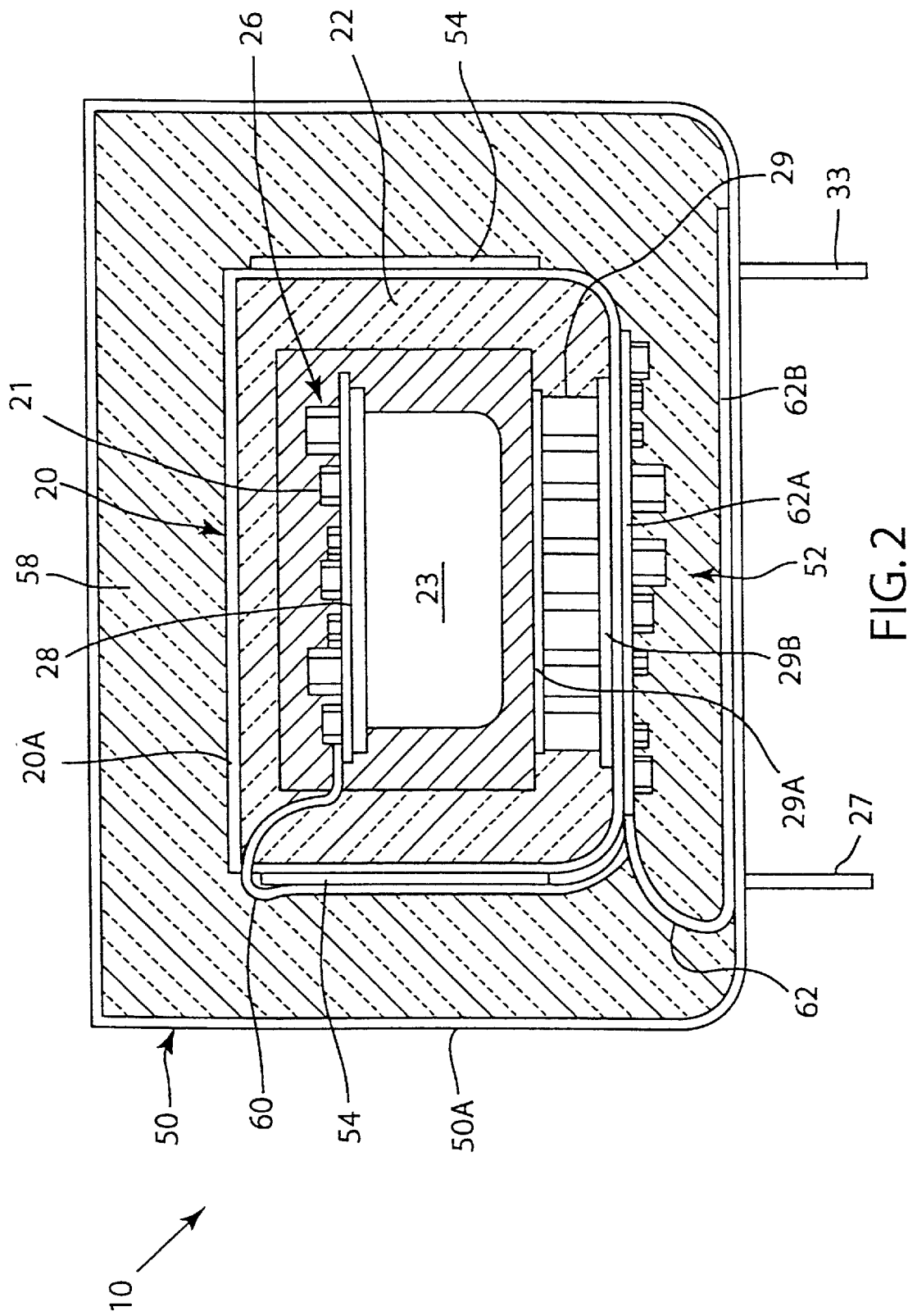
FIG. 2 is a cross-sectional view of a dual oven oscillator using a thermoelectric module.

Referring to FIGS. 1 and 2, a dual oven oscillator using a thermoelectric module is shown. Oscillator assembly 10 includes an inner oven 20 and an outer oven 50 surrounding inner oven 20. Inner oven 20 contains a conventional oscillator 26 that is electrically connected to a crystal 23. Oven 20 has a metal shell or cover 20A. Crystal 23 stabilizes the frequency of the oscillator as is well known in the art. Oscillator 26 is mounted on substrate 28. Substrate 28 is either a printed circuit board or a ceramic substrate patterned with circuit lines. An inner oven temperature sensor 32 and a thermoelectric module 29 are also located inside inner oven 20. Sensor 32 would be mounted on substrate 28. Sensor 32 is a negative coefficient conventional thermistor. Temperature sensor 32 and a thermoelectric module or heat pump 29 are electrically connected to a control circuit 52. Thermoelectric module 29 is commercially available from Melcor Corporation, Trenton, N.J. An aluminum block 21 encircles oscillator 26 and crystal 23. Aluminum block 23 acts as a heat sink. Thermoelectric heat pump 29 is in thermal communication with block 23.

Thermoelectric module 29 cools inner oven 20 during operation. A thermoelectric module is a small solid state device that can operate as a heat pump. The module utilizes the Peltier effect to move heat and can also be called a thermoelectric cooler (TEC). The Peltier effect occurs when current passes through the junction of two different types of conductors it results in a temperature change. Bismuth telluride is primarily used as the semiconductor material, heavily doped to create either an excess (n-type) or a deficiency (p-type) of electrons. The semiconductors are connected electrically in series and sandwiched between two ceramic plates, 29A and 29B. When connected to a DC power source, the current causes heat to move from one ceramic plate to the other. This creates a hot plate 29B and a cold plate 29A. Cold plate 29A is in contact with aluminum block 21. Hot plate 29 is in contact with cover 20A. Inner thermal insulation 22 fills the space between cover 20A and block 21. An inner oven flexible cable 60 is used to electrically connect to substrate 28 for routing electrical signals and power to oscillator 26 and sensor 32. An electrical connection (not shown) is also made to the thermoelectric module 29.

A heater 54 is attached to cover 20A. Heater 54 is a conventional flexible cable heater. Inner oven flexible cable 60 is electrically connected to heater 54. Inner oven flexible cable 60 is electrically connected to outer oven flexible cable 62. Outer oven flexible cable 62 has an end 62A attached to cover 20A and another end 62B attached to an outer metal oven shell 50A. Output frequency terminal 27 and power terminal 33 are electrically connected to flexible cable 62. Power terminal 33 supplies power to the oscillator assembly 10. Output terminal 27 provides the stabilized reference frequency. A control circuit 52 is mounted on end 62A. Control circuit 52 is connected to outer oven temperature sensor 56 and heater 54. Sensor 56 is mounted to end 62A. Sensor 62 is a negative coefficient conventional thermistor. Outer thermal insulation 58 fills the space between cover 20A and block 21.

During operation of oscillator assembly 10, thermoelectric heat pump 29 generates a negative differential between the outer oven 50 and inner oven 20. In other words, the inner oven 20 is cooler than the outer oven 50. Thermoelectric devices are capable of precision temperature stabilization when powered by the proper control circuit. At the same time outer oven 50 is heated. The outer oven 50 is regulated by heater 54 and control circuit 52, so its temperature is 10° C. higher than the highest specified ambient temperature external to shell 50A.

The amount of heat to be pumped from the inner oven 20 is composed primarily of two components. The first component is due to the quiescent power dissipated by the oscillator circuit 26. An approximate worst case estimate for the oscillator power would be 100 mW. The second component comes from the heat gain from the surrounding ambient environment through the insulating medium. For a 1" diameter by 0.5" high inner oven block surrounded by 0.25" of polyurethane foam insulation operating at a temperature differential of 30° C., the equivalent energy lost would be about 0.3 W. The total amount of heat to be pumped by module 29 would therefore be 0.4 W.

Thermoelectric module 29 operating under these conditions would have a typical Coefficient of Efficiency of about 0.67. This would result in 0.6W of constant quiescent power being sunk into the outer oven 50. The heat efficiency of outer oven 50 would typically be about 30 mW/° C. The minimum differential that could be tolerated above the upper ambient while still maintaining control of the oven would therefore be 20° C. If the ambient temperature specification was set at +85° C., the outer oven would need to be set to about +105° to +110° C. With the heat pump 29 cooling the oscillator and crystal by 30° C., the inner oven internal temperature could be precisely controlled at +75° C. If the required ambient temperature did not extend to +85, these temperatures could be set even lower. Improved insulation materials and optimization of the operating parameters would also provide more efficient performance. With the oscillator operating at lower temperatures of +75° C., the mean time between failures (MTBF) of the assembly are improved and aging of the crystal resonator is reduced.

Temperature sensor 32 monitors the temperature of the inner oven 20. Temperature sensor 56 monitors the temperature of the outer oven 20. Control circuit 52 receives temperature signals as inputs from sensors 32 and 56 and proportionally regulates the power to heater 54 and thermoelectric module 29. Control circuit 52 maintains the desired temperature differential between the inner oven and the outer oven and between the outer oven and ambient.

A cylindrical oven shape is preferred. The radial symmetry yields a consistent thermal gradient profile while offering a relatively small footprint. A double oven oscillator using a thermoelectric module, as in the present invention, can be fabricated in approximately one third the volume of a conventional double oven oscillator. The smaller footprint is made possible by the elimination of an inner oven enclosure. The present invention allows for a wide temperature range ultra-stable oscillator in a smaller size package and at the same time offering the advantages of reduced operating temperature on the crystal and oscillator.

Variations of the Preferred Embodiment(s)

One of ordinary skill in the art of oscillator design, will realize many advantages from using the preferred embodiment. Further, one of ordinary skill in the art of making oscillators will realize that there are many different ways of accomplishing the preferred embodiment. For example, it is contemplated that heater 54 could be located outside the oven shell 50A. Similarly, the control circuit 52 could be located outside outer oven 50 or it could be located inside inner oven 20.

Even though, the embodiment discusses the use of one heater, it is contemplated to use more than one heater.

The embodiment discusses the use of an aluminum block 21 as a heat sink, it is contemplated to omit block 21 and locate the thermoelectric cooler adjacent oscillator 26.

Even though, the embodiment discussed operating the inner oven at a lower temperature than the outer oven, it is contemplated to operate the inner oven at a higher temperature than the outer oven.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. An ovenized oscillator assembly, comprising:

a) a first temperature controlled oven;

b) a substrate located inside the first oven, the substrate having a first and a second side;

c) an oscillator circuit mounted to the first side, the oscillator operable to produce a reference frequency;

d) a crystal mounted to the second side;

e) a heat sink surrounding the substrate;

f) a thermoelectric heat pump attached to the heat sink, the thermoelectric heat pump in thermal communication with the first temperature controlled oven, the thermoelectric heat pump adapted to keep the first oven at a first temperature;

g) a second temperature controlled oven, the first temperature controlled oven and the thermoelectric heat pump located inside the second temperature controlled oven;

h) a heater in thermal communication with the second temperature controlled oven, the heater keeping the second oven at a second temperature;

i) a first flexible cable connected to the oscillator circuit;

j) a second flexible cable mounted to the first oven, the first flexible cable electrically connected to the second flexible cable;

k) a control circuit mounted on the second flexible cable, the control circuit adapted to control the heater; and l) a plurality of terminals electrically connected to the second flexible cable.

2. The oscillator assembly according to claim 1, wherein the first temperature is less than the second temperature.

3. The oscillator assembly according to claim 1, wherein the first temperature is greater than the second temperature.

4. The oscillator assembly according to claim 1 wherein the first oven further comprises:

a) a temperature sensor, located in proximity to the crystal, for sensing the first temperature.

5. The oscillator assembly according to claim 1, wherein the second oven further comprises:

a) a temperature sensor, located in the second oven, for sensing the second temperature.

6. The oscillator assembly according to claim 4, wherein the temperature sensor is a thermistor.

7. The oscillator assembly according to claim 5, wherein the temperature sensor is a thermistor.

8. The oscillator assembly according to claim 1, wherein an insulator surrounds the heat sink.

9. The oscillator assembly according to claim 1, wherein an insulator surrounds the first oven.

\* \* \* \* \*